US008319096B2

(12) United States Patent
Ishikawa et al.

(10) Patent No.: US 8,319,096 B2
(45) Date of Patent: Nov. 27, 2012

(54) SEMICONDUCTOR SUBSTRATE, METHOD FOR FORMING ELECTRODE, AND METHOD FOR FABRICATING SOLAR CELL

(75) Inventors: Naoki Ishikawa, Annaka (JP); Hiroyuki Ohtsuka, Annaka (JP); Takenori Watabe, Annaka (JP); Satoyuki Ojima, Annaka (JP); Toyohiro Ueguri, Annaka (JP)

(73) Assignees: Shin-Etsu Handotai Co., Ltd., Tokyo (JP); Shin-Etsu Chemical Co., Ltd., Tokyo (JP)

( * ) Notice: Subject to any disclaimer, the term of this patent is extended or adjusted under 35 U.S.C. 154(b) by 465 days.

(21) Appl. No.: 12/309,229

(22) PCT Filed: Jul. 12, 2007

(86) PCT No.: PCT/JP2007/063881
§ 371 (c)(1),
(2), (4) Date: Jan. 12, 2009

(87) PCT Pub. No.: WO2008/018265
PCT Pub. Date: Feb. 14, 2008

(65) Prior Publication Data
US 2009/0194151 A1 Aug. 6, 2009

(30) Foreign Application Priority Data
Aug. 9, 2006 (JP) ................................. 2006-217439

(51) Int. Cl.
H01L 31/00 (2006.01)
H01B 1/22 (2006.01)
C04B 41/51 (2006.01)
(52) U.S. Cl. ......................... 136/256; 252/514; 106/1.19
(58) Field of Classification Search .................. 136/243, 136/258, 260, 263, 264, 256; 257/292, 293; 252/514; 106/1.19
See application file for complete search history.

(56) References Cited

U.S. PATENT DOCUMENTS
5,174,925 A * 12/1992 Fujii et al. ..................... 252/514
(Continued)

FOREIGN PATENT DOCUMENTS
JP    A-59-167056    9/1984
(Continued)

OTHER PUBLICATIONS
Jan. 10, 2012 Notification of Reasons for Refusal issued in Japanese Application No. 2006-217439 with partial English-language translation.
(Continued)

Primary Examiner — Basia Ridley
Assistant Examiner — Devina Pillay
(74) Attorney, Agent, or Firm — Oliff & Berridge, PLC

(57) ABSTRACT

The present invention is directed to a semiconductor substrate having at least an electrode formed thereon, in which the electrode has a multilayer structure including two or more layers, of the multilayer structure, at least a first electrode layer directly bonded to the semiconductor substrate contains at least silver and a glass frit, and contains, as an additive, at least one of oxides of Ti, Bi, Zr, V, Nb, Ta, Cr, Mo, W, Mn, Fe, Co, Ni, Si, Al, Ge, Sn, Pb, and Zn, and, of an electrode layer formed on the first electrode layer, at least an uppermost electrode layer to be bonded to a wire contains at least silver and a glass frit and does not contain the additive. This makes it possible to form, on a semiconductor substrate, an electrode adhered to the semiconductor substrate with sufficient adhesive strength and adhered to a wire via solder with sufficient adhesive strength by lowering both contact resistance and interconnect resistance.

8 Claims, 2 Drawing Sheets

U.S. PATENT DOCUMENTS 5,279,682 A * 1/1994 Wald et al. .................. 136/256
2005/0253270 A1 * 11/2005 Sasaki ........................ 257/758

FOREIGN PATENT DOCUMENTS

| JP | A-61-208701 | 9/1986 |
| JP | A-6-318724 | 11/1994 |
| JP | A-11-312813 | 11/1999 |
| JP | A-2001-313400 | 11/2001 |
| JP | A-2004-235276 | 8/2004 |
| JP | A-2005-129660 | 5/2005 |

OTHER PUBLICATIONS

May 3, 2012 Office Action issued in Australian Patent Application No. 2007282721.

* cited by examiner

SEMICONDUCTOR SUBSTRATE, METHOD FOR FORMING ELECTRODE, AND METHOD FOR FABRICATING SOLAR CELL

TECHNICAL FIELD

The present invention relates to a semiconductor substrate having an electrode formed thereon; and a method for forming an electrode on a semiconductor substrate, and a method for fabricating a solar cell using it.

BACKGROUND ART

A structure of a conventional typical solar cell is shown in FIG. 3. It has a structure in which, on the side of one main surface of a p-type Si substrate 21 formed of single-crystal or polycrystalline Si having a thickness of the order of 0.25 mm, an emitter layer ($n^+$ layer) 22 into which P or the like is diffused at a depth of 0.1 to 0.5 μm is provided, and an antireflection film 23 formed of $Si_3N_4$, $SiO_2$, or the like, for reducing the front surface reflectance and a front surface electrode (light receiving surface electrode) 34 for extracting current are formed thereon; on the other side (the side of a back surface) of the Si substrate, a BSF layer ($p^+$ layer) 25 into which Al or the like is diffused in high concentration is formed, and, on this back surface, a back surface electrode 26 is formed.

When a solar cell of this type is fabricated, the front surface electrode 34 is in general formed by the following printing/firing process because of its easiness, low costs, and the like. That is, as a material of the front surface electrode, a conductive paste mixed with a silver powder is in general used; and, after this conductive paste is applied by screen printing or the like, it is sintered at a high temperature in a firing furnace so as to form the front surface electrode. In this electrode formation method, in general, a conductive paste containing a silver powder, a glass frit, an organic vehicle, and an organic solvent as the main components is used.

The contact resistance between the front surface electrode 34 formed by this method and the Si substrate 21 and the wire resistance of the electrode greatly affect the conversion efficiency of the solar cell, and, in order to achieve high efficiency (low cell series resistance, a high fill factor), the contact resistance and the interconnect resistance of the front surface electrode 34 are required to be sufficiently low.

However, in the conventional electrode structure described above, the glass frit contained in the conductive paste is melted during high-temperature sintering, and part thereof runs down to the interface between the Si substrate and the silver electrode and forms a barrier layer, making it impossible to obtain contact resistance which is low enough to achieve a high-efficiency solar cell.

To address this problem, an attempt has conventionally been made to lower contact resistance by performing heat treatment in an atmosphere of hydrogen, immersion in a diluted hydrofluoric acid solution, or the like, after high-temperature sintering. However, treatment with hydrogen is at a disadvantage in terms of mass productivity and cost, considering factors such as special equipment and a large amount of input energy required to perform such treatment and the difficulty of handling hydrogen. Moreover, since treatment with hydrofluoric acid takes a time of the order of several tens of seconds to several minutes, the glass frit functioning as an adhesive in the silver electrode components is melted, causing a problem of a reduction in adherability and hence detachment of the electrode. This sort of problem would impair the reliability of the solar cell.

On the other hand, it has been known that mixing an oxide such as zinc oxide into a conductive paste makes it possible to lower contact resistance without performing the aforementioned heat treatment in an atmosphere of hydrogen, treatment with hydrofluoric acid, or the like, after high-temperature firing, and to provide a good ohmic contact (for example, see Japanese Patent Application Laid-open (kokai) No. 2001-313400, Japanese Patent Application Laid-open (kokai) No. 2004-235276, and Japanese Patent Application Laid-open (kokai) No. 2005-129660). It is true that the ohmic contact formed by mixing an oxide such as zinc oxide into a conductive paste is improved as the additive amount thereof is increased; however, it tends to hamper sintering of silver when the electrode is fired, leading to an increase in interconnect resistance due to an increase in the specific resistance of the sintered silver product. That is, the problem is that, when the additive amount exceeds a certain level, an improvement of the ohmic contact and the interconnect resistance increasing effect act in an opposing manner, interfering with a significant improvement of the performance of the solar cell as compared with the conventional one. Furthermore, another problem is that its drawback such as a decrease in the adhesive strength between the electrode and a wire caused by the occurrence of so-called silver leaching by which, for soldering to a solder coated ribbon for connection with the solar cell, unsintered silver forms a compound with Sn contained in the solder and disappears in the solder results in a decrease in performance of the solar cell or hinders modularization thereof.

DISCLOSURE OF INVENTION

The present invention has been made in view of the problems described above, and an object thereof is to form, on a semiconductor substrate, an electrode adhered to the semiconductor substrate with sufficient adhesive strength and adhered to a wire via solder with sufficient adhesive strength by lowering both contact resistance and interconnect resistance.

The present invention has been made to solve the above problems, and provides a semiconductor substrate having at least an electrode formed thereon, in which the electrode has a multilayer structure including two or more layers, of the multilayer structure, at least a first electrode layer directly bonded to the semiconductor substrate contains at least silver and a glass frit, and contains, as an additive, at least one of oxides of Ti, Bi, Zr, V, Nb, Ta, Cr, Mo, W, Mn, Fe, Co, Ni, Si, Al, Ge, Sn, Pb, and Zn, and of an electrode layer formed on the first electrode layer, at least an uppermost electrode layer to be bonded to a wire contains at least silver and a glass frit and does not contain the additive.

With such a semiconductor substrate having an electrode having a multilayer structure including two or more layers, in which at least a first electrode layer contains silver and a glass frit and contains the above-described additive, and, of an electrode layer formed on the first electrode layer, at least an uppermost electrode layer to be bonded to a wire contains at least silver and a glass frit and does not contain the above-described additive, it is possible to lower the contact resistance between the electrode and the semiconductor substrate while allowing the electrode to be adhered to the semiconductor substrate with sufficient adhesion. In addition, as a result of the silver in the uppermost electrode layer having been sintered to a satisfactory extent, it is possible to lower interconnect resistance and prevent a silver leaching phenomenon from occurring between the uppermost electrode layer and the solder, making it possible to join the electrode and the wire together with sufficient soldering strength.

In this case, it is preferable that the content of the additive contained in the at least first electrode layer be 1 wt % or more but less than 15 wt %.

As just described, when the content of the additive contained in the at least first electrode layer is 1 wt % or more but less than 15 wt %, it is possible to lower the contact resistance between the electrode and the semiconductor substrate more reliably.

In addition, the semiconductor substrate described above may be configured so that the semiconductor substrate has a pn junction, the electrode is a front surface electrode, on the side of the front surface electrode, an antireflection film is provided, on the side of a back surface, a back surface electrode is provided, and the semiconductor substrate operates as a solar cell.

As just described, by making the above-described semiconductor substrate operate as a solar cell, it is possible to achieve a high-efficiency solar cell that can form an ohmic contact, has low contact resistance and low interconnect resistance, and has stable characteristics. Moreover, it is possible to achieve a solar cell in which the front surface electrode and the semiconductor substrate adhere to each other with sufficient adhesive strength and the front surface electrode and the wire adhere to each other with sufficient adhesive strength.

Moreover, the present invention provides a method for forming an electrode, including: a step of forming a first electrode layer by applying a conductive paste containing at least a silver powder, a glass frit, an organic vehicle, and an organic solvent, and containing, as an additive, at least one of oxides of Ti, Bi, Zr, V, Nb, Ta, Cr, Mo, W, Mn, Fe, Co, Ni, Si, Al, Ge, Sn, Pb, and Zn to a semiconductor substrate, and applying heat; and a step of forming an uppermost electrode layer, which is to be bonded to a wire, by applying, above the first electrode layer, a conductive paste which contains at least a silver powder, a glass frit, an organic vehicle, and an organic solvent and does not contain the additive, and applying heat.

As just described, with the method for forming an electrode, including: a step of forming a first electrode layer by applying a conductive paste containing the above-described additive to a semiconductor substrate and applying heat; and a step of forming an uppermost electrode layer, which is to be bonded to a wire, by applying, above the first electrode layer, a conductive paste which does not contain the above-described additive and applying heat, it is possible to form, on a semiconductor substrate, an electrode whose contact resistance with the semiconductor substrate is lowered without decreasing the adhesion of the electrode with the semiconductor substrate. In addition, as a result of the silver in the uppermost electrode layer having been sintered to a satisfactory extent, it is possible to form an electrode having low interconnect resistance, and prevent a silver leaching phenomenon from occurring between the uppermost electrode layer and the solder, making it possible to join the electrode and the wire together with sufficient soldering strength. Moreover, since there is no need to perform treatment with hydrofluoric acid, it is possible to prevent a decrease in adhesion of the electrode with the semiconductor substrate.

In this case, it is preferable that the content of the additive contained in the conductive paste forming the at least first electrode layer be 1 wt % or more but less than 15 wt %.

As just described, when the content of the additive contained in the conductive paste forming the at least first electrode layer is 1 wt % or more but less than 15 wt %, it is possible to lower the contact resistance with the semiconductor substrate more reliably.

In addition, the present invention provides a method for fabricating a solar cell, including at least: a step of forming an antireflection film on the side of a front surface of a semiconductor substrate having a pn junction; a step of forming a front surface electrode in an antireflection film portion; and a step of forming a back surface electrode on the side of a back surface, in which at least formation of the front surface electrode is performed by the above-described method for forming an electrode.

As just described, with the method for fabricating a solar cell, including a step of forming an electrode according to the above-described method for forming an electrode, it is possible to fabricate a solar cell having a front surface electrode which has low contact resistance and low interconnect resistance, adheres to the solar cell substrate with sufficient adhesion, and is soldered to the wire with sufficient soldering strength. Then, such a solar cell makes it possible to improve a fill factor, conversion efficiency, and the like.

With the semiconductor substrate according to the present invention, it is possible to achieve a semiconductor substrate having an electrode whose contact resistance with the semiconductor substrate and interconnect resistance are both low and which adheres to the semiconductor substrate with sufficient adhesion and is soldered to the wire with sufficient soldering strength.

In addition, according to the method for forming an electrode according to the present invention, it is possible to form, on a semiconductor substrate, an electrode whose contact resistance with the semiconductor substrate and interconnect resistance are both low and which adheres to the semiconductor substrate with sufficient adhesion and is soldered to the wire with sufficient soldering strength. Moreover, there is no need to perform an additional treatment for lowering the contact resistance, it is possible to reduce the number of formation steps and realize cost reduction. Then, by applying such methods for forming a semiconductor substrate and an electrode to a solar cell, it is possible to fabricate a high-efficiency and low-cost solar cell.

BEST MODE FOR CARRYING OUT THE INVENTION

Figure 1:
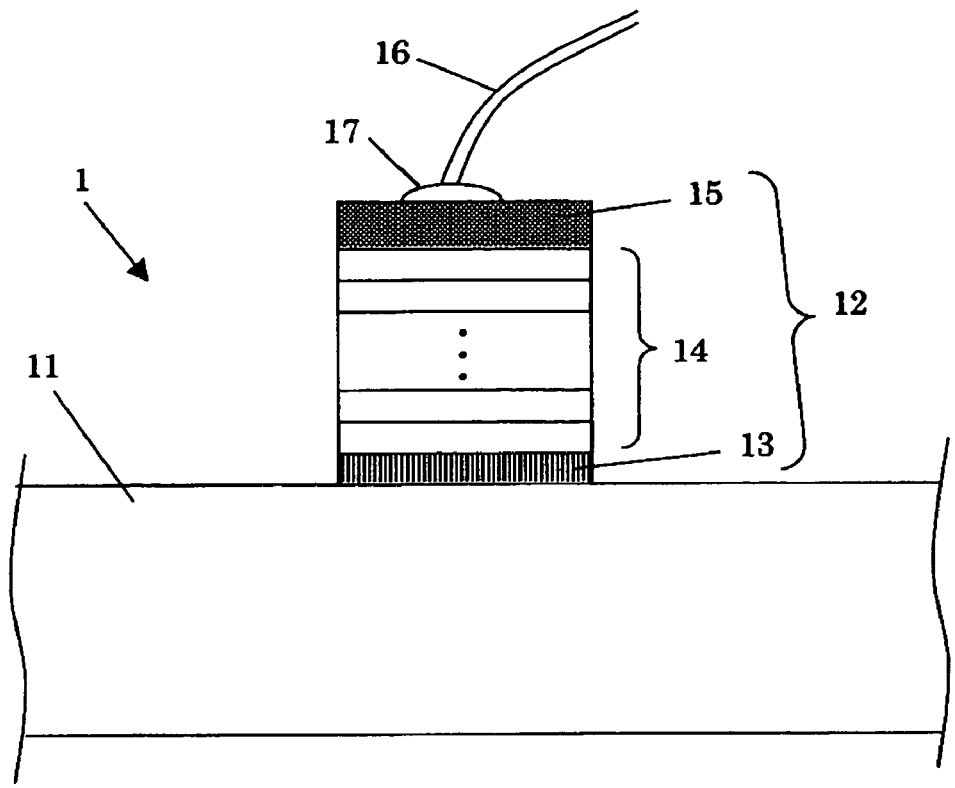
FIG. 1 is a schematic sectional view of a semiconductor substrate provided with an electrode according to the invention.

Hereinafter, the invention will be explained in further detail.

As described above, when an attempt is made to lower the contact resistance between an electrode and a semiconductor substrate by performing heat treatment in an atmosphere of hydrogen, immersion in a diluted hydrofluoric acid solution, or the like, after applying a conductive paste containing a silver powder to the semiconductor substrate and then firing it at a high temperature, treatment with hydrogen has a problem with mass productivity and cost, because it requires special equipment and a large amount of input energy, and hydrogen is difficult to handle; if treatment with hydrofluoric acid is performed, a glass frit functioning as an adhesive in the silver electrode components is melted, causing a problem of a reduction in adherability and hence detachment of the electrode.

In addition, when an oxide such as zinc oxide is mixed into the conductive paste, there arise problems, such as an increase in interconnect resistance due to an increase in the specific resistance of a sintered silver product as a result of sintering of silver being hampered, and a decrease in the adhesive strength between an electrode and a wire due to the occurrence of silver leaching.

For these problems, the inventors earnestly studied a method for achieving the lowest possible contact resistance of an electrode without performing heat treatment in an atmosphere of hydrogen or immersion in a diluted hydrofluoric acid solution, and for forming an electrode that does not suffer from a silver leaching phenomenon at a junction between the electrode and the wire.

In order to improve an ohmic contact, it is necessary to increase the additive amount of an oxide such as zinc oxide in a conductive paste; however, since this hampers sintering of silver when the electrode is fired and leads to an increase in interconnect resistance, in the case of a single-layer electrode, the additive amount is limited to a certain level, resulting in a limited effect of improving the performance of a solar cell. Against this background, the inventors have found out that it is possible to obtain a resistance lowering effect for the entire electrode to a satisfactory extent by adopting a multilayer electrode and forming an electrode layer containing no additive in the second layer or a layer above it, that is, the electrode layer whose specific resistance is sufficiently low.

Furthermore, the inventors have found out that it is possible to make an electrode have low contact resistance at a junction with the semiconductor substrate, have excellent adhesive properties, and suffer less from silver leaching at a junction with the wire by making the electrode have a multilayer structure including two or more layers, adding the above-described additive which is effective in lowering contact resistance to at least a first electrode layer which is directly bonded to the substrate, and not adding such an additive which causes an increase in interconnect resistance and the occurrence of silver leaching to at least the uppermost electrode layer which is bonded to the wire.

Then, the inventors conducted additional experiments and studies for the optimization of various conditions, and completed the invention.

Hereinafter, the invention will be explained more specifically with reference to the drawings, but the invention is not limited to those explained below.

FIG. 1 is a schematic view of a semiconductor substrate 1 according to the invention.

For example, on a front surface of a semiconductor substrate 11, such as a silicon single crystal substrate, serving as a support substrate, an electrode 12 is formed, and this electrode 12 has a multilayer structure including two or more layers. The multilayer structure of the electrode 12 has formed therein a first electrode layer 13 which is directly bonded to the semiconductor substrate 11, an intermediate electrode layer 14 including a second electrode layer formed directly on the first electrode layer, a third electrode layer formed directly on the second electrode layer, . . . , and, as the uppermost layer, an uppermost electrode layer 15. It is to be noted that the electrode 12 is simply required to include two or more layers; when the electrode 12 includes two layers, it is provided with no intermediate electrode layer 14, and the second electrode layer is formed directly on the first electrode layer 13 as the uppermost electrode layer 15. The uppermost electrode layer 15 is bonded to a wire 16 by solder 17. Of the electrode layers forming the electrode 12, at least the first electrode layer 13 contains at least silver and a glass frit, and contains as an additive at least one of oxides of Ti, Bi, Zr, V, Nb, Ta, Cr, Mo, W, Mn, Fe, Co, Ni, Si, Al, Ge, Sn, Pb, and Zn, and at least the uppermost electrode layer 15 contains at least silver and a glass frit and does not contain the above-described additive. The intermediate electrode layer 14 contains at least silver and a glass frit, but may or may not contain the above-described additive.

An electrode in the semiconductor substrate of the invention having the structure described above can be formed as follows.

After the semiconductor substrate 11 serving as the support substrate is prepared, the first electrode layer 13 is first formed on the semiconductor substrate 11. At this time, for a reason, which will be described later, a thin oxide film, a thin nitride film, or the like, may be formed on the semiconductor substrate 11. The formation of the first electrode layer 13 can be performed by applying a conductive paste containing at least a silver powder, a glass frit, an organic vehicle, and an organic solvent, and containing, in addition to them, as an additive, at least one of oxides of Ti, Bi, Zr, V, Nb, Ta, Cr. Mo, W. Mn, Fe, Co, Ni, Si, Al, Ge, Sn, Pb, and Zn to the semiconductor substrate 11, and by heating it at a temperature of 150 to 200° C., for example, so as to vaporize the organic solvent contained in the conductive paste. As the organic vehicle and the organic solvent, it is simply necessary to mix a commonly used organic vehicle and organic solvent.

Next, when the electrode 12 includes three or more layers, the intermediate electrode layer 14 is formed between the first electrode layer 13 and the uppermost electrode layer 15 as follows. The intermediate electrode layer 14 can be performed by applying a conductive paste containing at least a silver powder, a glass frit, an organic vehicle, and an organic solvent to the first electrode layer 13, and by heating it at a temperature of 150 to 200° C., for example, so as to vaporize the organic solvent contained in the conductive paste. Incidentally, the conductive paste used for forming the intermediate electrode layer 14 may or may not contain the above-described additive, either of which can be chosen appropriately. By repeating the above procedure, one or more electrode layer(s) 14 is formed.

Next, the uppermost electrode layer 15 is formed. The uppermost electrode layer 15 can be performed by applying a conductive paste which contains at least a silver powder, a glass frit, an organic vehicle, and an organic solvent and does not contain the above-described additive to the intermediate electrode layer 14, and by heating it at a temperature of 150 to 200° C., for example, so as to vaporize the organic solvent contained in the conductive paste.

When the electrode 12 includes two layers, although the uppermost electrode layer 15 is formed directly on the first electrode layer 13, it is formed by the same formation method as described above.

After the layers of the electrode 12 are formed as described above, firing is performed at a high temperature of 600 to 850° C., for example, for one to five minutes, for example. As a result of this firing, the organic vehicle contained in the conductive paste of each layer disappears, and the silver in each layer of the electrode is sintered, whereby the electrode 12 is formed. In addition, as a result of heating being performed for this firing, even when the electrode 12 is formed on a thin oxide film or the like having a thickness of 100 nm or less, for example, such an oxide film or the like is melted concurrently with heating for firing, and the electrode breaks through the oxide film or the like and adheres to the semiconductor layer itself of the semiconductor substrate 11 in such a way as to be directly bonded thereto (which is called fire-through).

As a result of the electrode formed on the semiconductor substrate being structured as described above, the following effects are produced.

That is, in the first electrode layer 13 directly bonded to the semiconductor substrate 11, due to the above-described additive added thereto, the contact resistance with the semiconductor substrate is low, making it possible to provide an ohmic contact with stability. Although the reason why the presence of such an additive lowers contact resistance as described above is not yet completely clear, it is believed that a Ti, Bi, Zr, V, Nb, Ta, Cr, Mo, W, Mn, Fe, Co, Ni, Si, Al, Ge, Sn, Pb, or Zn component in the oxide acts on the glass frit during firing and part thereof merges into it, and, thereafter, the mixture obtained as a result of this merging acts on the oxide film or the like on the semiconductor substrate, contributing to an improvement in contact properties and adhesive strength. The glass frit inherently contains oxides of Pb, B. Si, and the like, and can lower the contact resistance between the electrode and the semiconductor substrate; by additionally adding these additives to the electrode layer, it is possible to further lower the contact resistance.

In addition, the uppermost electrode layer 15 bonded to the wire 16 via the solder 17 does not contain the above-described additive.

As mentioned earlier, in the electrode layer containing the above-described additive, sintering of silver is hampered. When sintering of silver is hampered as just described, it becomes a factor that increases the specific resistance of the electrode layer, and, when a contact with the solder is made for connection with the wire, the reaction with Sn in the solder occurs, whereby a so-called silver leaching phenomenon by which it merges into the solder tends to occur.

On the other hand, since the uppermost electrode layer 15 of the electrode 12 formed on the semiconductor substrate according to the invention does not contain the above-described additive, sintering of silver is performed to a satisfactory extent in the process of firing the electrode, making it possible to lower the specific resistance of the electrode layer to a satisfactory level and reduce the occurrence of silver leaching.

That is, the electrode 12 as a whole can achieve lower contact resistance between the electrode and the semiconductor substrate and lower interconnect resistance, and it is possible to solder the wire to the electrode satisfactorily.

In addition, when such an electrode is formed, there is no need to perform heat treatment in an atmosphere of hydrogen, immersion in a diluted hydrofluoric acid solution, or the like, it is possible to reduce the number of electrode forming steps and cost. Moreover, it is possible to prevent a decrease in adhesion between the electrode and the semiconductor substrate, which becomes noticeable when immersion in a diluted hydrofluoric acid solution is performed.

Incidentally, it is preferable that the content of the above-described additive added to the first electrode layer 13 be 1 wt % or more but less than 15 wt %. Moreover, when the above-described additive is added to the intermediate electrode layer 14, the content thereof is made equal to the content above. The above-mentioned content of the above-described additive in the electrode layer can be largely attained by setting the content of the above-described additive in the conductive paste to 1 wt % or more but less than 15 wt % when the first electrode layer 13 is formed by using the conductive paste.

Setting the content of the above-described additive in the electrode layer to such a value is preferable, because this makes it possible to lower the contact resistance between the electrode and the semiconductor substrate more reliably. If the content of the above-described additive is 1 wt % or more, a contact resistance lowering effect is sufficient. On the other hand, if the content of the above-described additive is less than 15 wt %, it does not hamper sintering of silver or increase the specific resistance of the electrode, making it possible to obtain a sufficient resistance lowering effect in the semiconductor substrate as a whole including the electrode.

Figure 2:
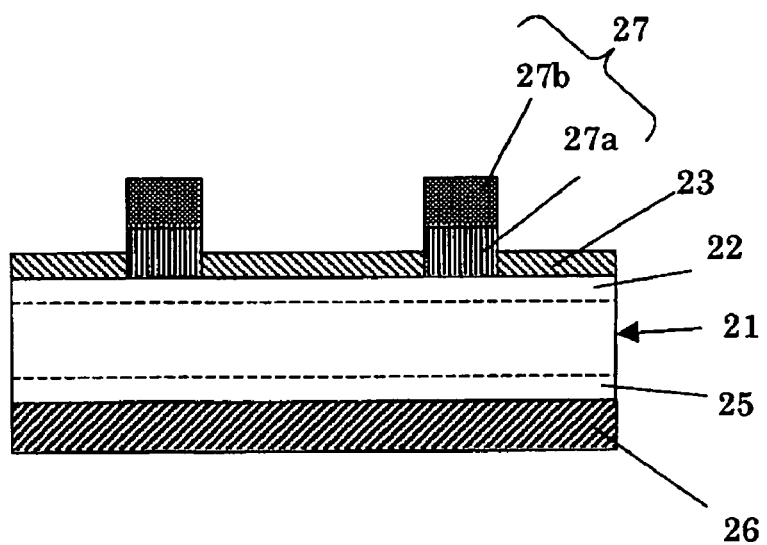
FIG. 2 is a schematic sectional view of a specific example of a semiconductor substrate provided with an electrode according to the invention.

Such an electrode 12 is suitably applied in particular to a front surface electrode of a solar cell. A schematic view of an example of a solar cell according to the invention is shown in FIG. 2. The structure thereof is the same as that of a conventional solar cell except for the front surface electrode. For example, the following structure is possible. On the side of one main surface of a p-type Si substrate 21 formed of single-crystal or polycrystalline Si, an emitter layer ($n^+$ layer)-22 into which P or the like is diffused at a depth of 0.1 to 0.5 μm is provided, and an antireflection film 23 formed of $Si_3N_4$, $SiO_2$, or the like, for reducing the front surface reflectance and a front surface electrode (light receiving surface electrode) 27 for extracting current are formed thereon; on the other side (the side of a back surface) of the Si substrate, a back surface electrode 26 is formed, and a BSF layer ($p^+$ layer) 25 into which Al or the like is diffused in high concentration is formed as needed. Of them, the front surface electrode 27 includes a first electrode layer 27a and a second electrode layer (uppermost electrode layer) 27b, of which the first electrode layer 27a contains at least silver and a glass frit, and contains as an additive at least one of oxides of Ti, Bi, Zr, V, Nb, Ta, Cr, Mo, W, Mn, Fe, Co, Ni, Si, Al, Ge, Sn, Pb, and Zn, and the second electrode layer 27b (uppermost electrode layer) contains at least silver and a glass frit and does not contain the above-described additive.

FIG. 2 shows a case in which the front surface electrode 27 includes two layers; however, the electrode structure shown in FIG. 1 can be applied to the front surface electrode 27, and it may have an intermediate electrode layer and include three or more electrode layers. In addition, here, the example deals with a case in which the semiconductor substrate of the invention is used in the solar cell. However, the invention is not limited thereto, and can be applied to a semiconductor substrate of any type as long as it has an electrode.

Such a solar cell can be fabricated, for example, as follows.

For an as-cut single crystal {100} p-type silicon substrate 21 having a thickness of the order of 0.1 to 1.0 mm and having a resistivity of 0.1 to 5 Ω·cm by doping high purity silicon with a group-III element such as boron or gallium, the slice damage removal process and texture (irregularities for optical confinement) formation are performed. The texture can be easily formed by immersion in a heated alkali solution (concentration: several to several tens percent, temperature: 60 to 100° C.) of sodium hydroxide, potassium hydroxide, potassium carbonate, sodium carbonate, sodium acid carbonate, or the like, for about 10 to 30 minutes. A predetermined amount of 2-propanol is often dissolved into the above-described solution so as to accelerate a reaction. For the formation of a uniform texture, it is preferable to use a solution obtained by mixing several percent 2-propanol into a solution of sodium hydroxide or potassium hydroxide concentration of several percent, the solution being heated to 60 to 70° C.

After the formation of texture, the semiconductor substrate 21 is cleaned in an acid aqueous solution such as hydrochloric acid, sulfuric acid, nitric acid, hydrofluoric acid, or a mixture thereof. From the standpoint of economy and efficiency, cleaning in hydrochloric acid is preferable. In order to improve the cleanness, cleaning may be performed using a hydrochloric acid solution mixed with several percent hydrogen peroxide and heated to 60 to 90° C.

Next, an emitter layer 22 is formed by a vapor-phase diffusion method using phosphorus oxychloride. In order to prevent diffusion to the back surface, it is preferable that vapor-phase diffusion be performed in such a way that they are placed on a diffusion board in pairs with the back surfaces thereof brought into contact with each other. Specifically, heating treatment is performed in an atmosphere of phosphorus oxychloride at a temperature of 820 to 880° C. for several tens of minutes, whereby an n-type layer is formed on the light receiving surface. The depth of the emitter layer thus formed is set at 0.2 to 1.0 um, and the sheet resistance is set at 40 to 150Ω/□. After diffusion, the phosphorus glass formed as a result of diffusion is removed by immersion in a several percent hydrofluoric acid solution for several minutes.

After this, formation of an antireflection film 23 on the front surface is performed. As the antireflection film 23, not only silicon oxide and silicon nitride, but also cerium oxide, alumina, tin dioxide, titanium dioxide, magnesium fluoride, tantalum oxide, and the like, and a two-layer film obtained by combining two of them are used, and it is possible to use any of them. The antireflection film is formed by using PVD, CVD, or the like, and can be formed by any of these methods. In order to fabricate a high-efficiency solar cell, the one formed of silicon nitride by remote plasma CVD is preferable, because it can achieve a low surface recombination rate.

Then, a back surface electrode 26 is formed on the back surface so as to be 10 to 50 μm. As the back surface electrode 26, metal such as silver or copper is used, but Al is most preferable in the interests of economy, workability, and contact with silicon. Deposition of the metal layer is possible by any of sputtering, vacuum deposition, screen printing, and the like. The metal electrode is uniformly deposited on the back surface. Here, the electrode containing Al as the main component by using screen printing is desirable, because firing it allows Al to diffuse into the Si substrate at a junction with the Si substrate, whereby the Si substrate is able to form a back surface electric field region (a BSF layer; a highly-doped $p^+$ region) 25 containing a large amount of p-type impurities.

Next, a front surface electrode 27 of the invention is formed as follows. A first electrode layer 27a is formed by, after placing a conductive paste which contains a silver powder, a glass frit, an organic vehicle, and an organic solvent as the main components, and to which the above-described additive is added, and a second electrode layer (in this case, serving as the "uppermost electrode layer") 27b is formed by, after placing a conductive paste which contains a silver powder, a glass frit, an organic vehicle, and an organic solvent as the main components, and does not contain the above-described additive, on the front surface of the antireflection film, drying the organic solvent, and then firing them at a temperature of 600 to 850° C. for one to five minutes. At this time, as described above, even when the layers of the front surface electrode 27 are formed on the antireflection film, the antireflection film is melted as a result of heating for firing, and the front surface electrode 27 breaks through the antireflection film and adheres to the semiconductor layer itself of the semiconductor substrate 21 in such a way that the electrode is directly bonded thereto. It is to be noted that the formation of the front surface electrode 27 and the formation of the back surface electrode 26 may be performed in the reverse order.

EXAMPLES

Hereinafter, the invention will be explained more specifically by examples of the invention and comparative examples. However, the invention is not limited to them.

Example 1

Ten solar cells were fabricated by performing the following process for ten semiconductor substrates.

First, a boron-doped {100} p-type as-cut silicon substrate 21 measuring 15 cm per side, having a thickness of 250 μm, and having a resistivity of 2.0Ω·cm was prepared. Subsequently, a semiconductor substrate was fabricated by removing a damaged layer by a concentrated potassium hydroxide solution, forming texture, forming an emitter layer 22 subjected to heat treatment in an atmosphere of phosphorus oxychloride at a temperature of 850° C., removing phosphorus glass, forming an antireflection film 23, and forming a back surface electrode 26 by screen printing a paste containing aluminum as the main component all over the back surface and then drying the organic solvent.

On the semiconductor substrate, which had undergone the step of forming the back surface electrode 26, a front surface electrode 27 was formed as follows.

First, a conductive paste which contains a silver powder, a glass frit, an organic vehicle, and an organic solvent as the main components and contains 5 wt % ZnO as an additive was applied to the antireflection film formed on the semiconductor substrate by screen printing, and the organic solvent was dried in a 150° C. clean oven, whereby a first electrode layer 27a was formed. Next, a conductive paste which contains a silver powder, a glass frit, an organic vehicle, and an organic solvent as the main components and does not contain an additive such as ZnO was applied to the first electrode layer, and the organic solvent was dried in a 150° C. clean oven, whereby a second electrode layer 27b serving as the uppermost electrode layer was formed. The semiconductor substrate having these electrode layers formed thereon was heated in a near-infrared furnace whose maximum temperature was set at 750° C. for five minutes, whereby the entire electrode 27 was fired.

For the ten solar cells fabricated in the manner as described above, solar cell characteristic evaluation was conducted and the tensile strength of the electrode was measured.

Characteristic evaluation was conducted by carrying out electrical measurements (short-circuit current density, open-circuit voltage, fill factor, and conversion efficiency) with a solar simulator (irradiation intensity: 1 kW/m², spectrum: AM 1.5 global) in an atmosphere of 25° C. Based on the measurement results thus obtained, it is possible to assess the effect of lowering of contact resistance of the electrode and lowering of interconnect resistance.

The tensile strength of the electrode portion was measured as a tensile force by attaching copper foil to the electrode portion by soldering and measuring the tensile force with which the copper foil came off or a breakdown of the cell occurred when it was pulled in a vertical direction.

Example 2

Ten solar cells having a front surface electrode with a three-layer structure were fabricated by a method, which is similar to Example 1, but is different therefrom in that electrode layer formation was performed three times as follows.

First, a conductive paste which contains a silver powder, a glass frit, an organic vehicle, and an organic solvent as the main components and contains 5 wt % ZnO as an additive was applied, and the organic solvent was dried in a 150° C. clean oven, whereby a first electrode layer was formed. Next, a conductive paste which contains a silver powder, a glass frit, an organic vehicle, and an organic solvent as the main components and does not contain an additive such as ZnO was applied to the first electrode layer, and the organic solvent was dried in a 150° C. clean oven, whereby a second electrode layer was formed. Next, a conductive paste which is the same as the conductive paste forming the second electrode layer, that is, which contains a silver powder, a glass frit, an organic vehicle, and an organic solvent as the main components and does not contain an additive such as ZnO was applied to the second electrode layer, and the organic solvent was dried in a 150° C. clean oven, whereby a third electrode layer serving as the uppermost electrode layer was formed.

The semiconductor substrate having these electrode layers formed thereon was heated in a near-infrared furnace whose maximum temperature was set at 750° C. for five minutes, whereby the entire electrode was fired.

For the ten solar cells fabricated in the manner as described above, characteristic evaluation was conducted and the tensile strength of the electrode was measured as in Example 1.

Examples 3, 4, and 5

By a method which is similar to Example 1, but is different therefrom in that a two-layer electrode is formed on the solar cell by using ZnO as an additive added to the first electrode layer 27a and setting the contents thereof at 10 wt % (Example 3), 15 wt % (Example 4), and 20 wt % (Example 5), ten solar cells were fabricated for each case.

For the ten solar cells fabricated in the manner as described above, characteristic evaluation was conducted and the tensile strength of the electrode was measured as in Example 1.

Comparative Example 1

Figure 3:
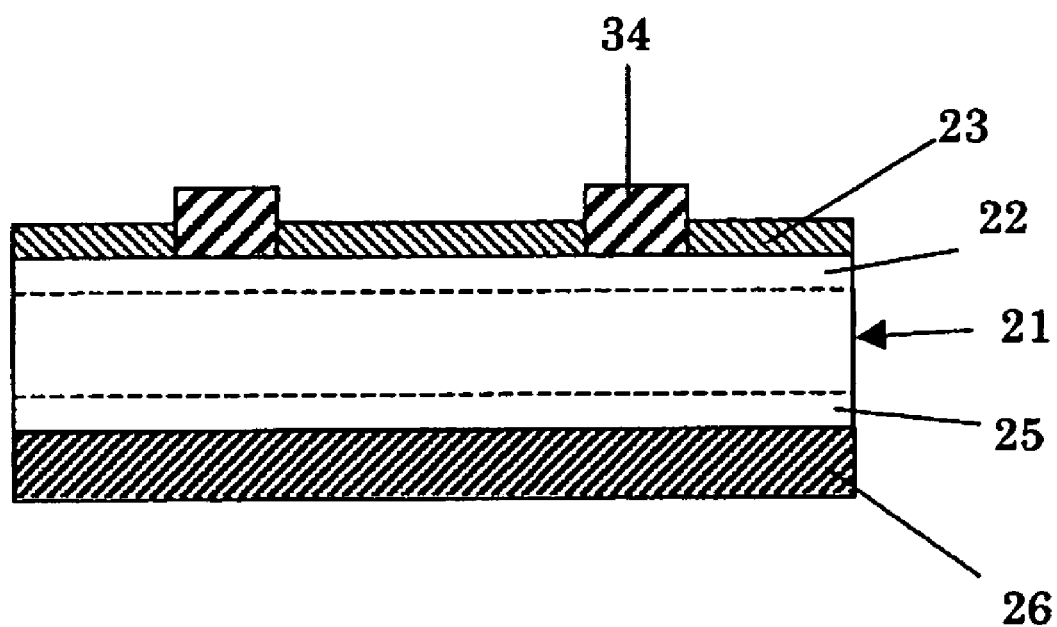
FIG. 3 is a schematic diagram of a structure of a conventional solar cell.

Ten solar cells whose back surface electrodes 26 were formed by a method which is similar to Example 1 and whose front surface electrodes were formed as follows, such that electrode layer formation was performed only once so as to provide the front surface electrode with a single-layer structure, that is, the solar cells having a structure shown in FIG. 3 were fabricated.

The formation of a front surface electrode 34 was performed by applying a conductive paste which contains a silver powder, a glass frit, an organic vehicle, and an organic solvent as the main components and does not contain an additive such as ZnO, and drying the organic solvent in a 150° C. clean oven, and then it was heated in a near-infrared furnace whose maximum temperature was set at 750° C. for five minutes, whereby the front surface electrode 34 was fired.

For the ten solar cells fabricated in the manner as described above, characteristic evaluation was conducted and the tensile strength of the electrode was measured as in Example 1 (measurement (a)).

In addition, after the measurement (a), immersion in a diluted hydrofluoric acid solution was performed for 20 seconds. For the ten solar cells subjected to such treatment, characteristic evaluation was conducted again and the tensile strength of the electrode was measured again as in Example 1 (measurement (b)).

Comparative Example 2

As is the case with Comparative Example 1, ten solar cells whose back surface electrodes 26 were formed by a method which is similar to Example 1 and whose front surface electrodes were formed as follows, such that electrode layer formation was performed only once so as to provide the front surface electrode with a single-layer structure, that is, the solar cells having a structure shown in FIG. 3 were fabricated.

The formation of a front surface electrode 34 was performed by applying a conductive paste which contains a silver powder, a glass frit, an organic vehicle, and an organic solvent as the main components and contains 5 w % ZnO as an additive, and drying the organic solvent in a 150° C. clean oven, and then it was heated in a near-infrared furnace whose maximum temperature was set at 750° C. for five minutes, whereby the front surface electrode 34 was fired.

For the ten solar cells fabricated in the manner as described above, characteristic evaluation was conducted and the tensile strength of the electrode was measured as in Example 1.

Comparative Example 3

Ten solar cells were fabricated just like Example 1 except that ZnO was added to the first electrode layer 27a as an additive thereof and the content thereof was kept at 5 wt %, and ZnO was added to the second electrode layer 27b as an additive thereof and the content thereof was set at 5 wt %, whereby a two-layer electrode was formed on the solar cell.

For the solar cells fabricated in the manner as described above, characteristic evaluation was conducted and the tensile strength of the electrode was measured as in Example 1.

The results of Examples 1 to 5 and Comparative Examples 1 to 3 are shown in tables below. Table 1 shows the average measured values of electrical characteristics of the ten solar cells of each case, and Table 2 shows the average measured values of the tensile strength of the ten solar cells of each case. Incidentally, for Comparative Example 1, the results of the measurements (a) and (b) are shown as Comparative Example 1(a) and Comparative Example 1(b), respectively.

TABLE 1

| Sample | Electrode Structure | ZnO Content (wt %) | | Short-Circuit Current (mA/cm$^2$) | Open-Circuit Voltage (mV) | Fill Factor (%) | Conversion Efficiency (%) |
| --- | --- | --- | --- | --- | --- | --- | --- |
| Example 1 | Two-layer | First Layer | 5 | 35.2 | 622 | 77.7 | 17.0 |
|  |  | Second Layer | 0 |  |  |  |  |
| Example 2 | Three-layer | First Layer | 5 | 35.0 | 620 | 78.1 | 17.0 |
|  |  | Second Layer | 0 |  |  |  |  |
|  |  | Third Layer | 0 |  |  |  |  |

TABLE 1-continued

| Sample | Electrode Structure | | ZnO Content (wt %) | Short-Circuit Current (mA/cm²) | Open-Circuit Voltage (mV) | Fill Factor (%) | Conversion Efficiency (%) |
|---|---|---|---|---|---|---|---|
| Example 3 | Two-layer | First Layer | 10 | 35.1 | 622 | 78.5 | 17.1 |
| | | Second Layer | 0 | | | | |
| Example 4 | Two-layer | First Layer | 15 | 34.8 | 619 | 77.8 | 16.8 |
| | | Second Layer | 0 | | | | |
| Example 5 | Two-layer | First Layer | 20 | 34.7 | 617 | 74.3 | 15.9 |
| | | Second Layer | 0 | | | | |
| Comparative Example 1(a) | Single-layer | | 0 | 34.7 | 618 | 65.4 | 14.0 |
| Comparative Example 1(b) | Single-layer | | 0 | 34.9 | 619 | 74.1 | 16.0 |
| Comparative Example 2 | Single-layer | | 5 | 35.1 | 620 | 71.5 | 15.6 |
| Comparative Example 3 | Two-layer | First Layer | 5 | 34.9 | 621 | 74.5 | 16.1 |
| | | Second Layer | 5 | | | | |

TABLE 2

| Sample | Electrode Structure | | ZnO Content (wt %) | Tensile Strength (N/mm) | Strength Judgment |
|---|---|---|---|---|---|
| Example 1 | Two-layer | First Layer | 5 | 4.2 | Good |
| | | Second Layer | 0 | | |
| Example 2 | Three-layer | First Layer | 5 | 4.7 | Good |
| | | Second Layer | 0 | | |
| | | Third Layer | 0 | | |
| Example 3 | Two-layer | First Layer | 10 | 5.0 | Good |
| | | Second Layer | 0 | | |
| Example 4 | Two-layer | First Layer | 15 | 3.8 | Good |
| | | Second Layer | 0 | | |
| Example 5 | Two-layer | First Layer | 20 | 3.5 | Good |
| | | Second Layer | 0 | | |
| Comparative Example 1(a) | Single-layer | | 0 | 3.7 | Good |
| Comparative Example 1(b) | Single-layer | | 0 | 1.5 | Poor |
| Comparative Example 2 | Single-layer | | 5 | 1.8 | Poor |
| Comparative Example 3 | Two-layer | First Layer | 5 | 1.2 | Poor |
| | | Second Layer | 5 | | |

Table 1 has revealed the following. Comparative Example 2, in which it contains ZnO, achieves a higher fill factor with lowering contact resistance of the solar cell and achieves higher conversion efficiency, as compared with Comparative Example 1(a), in which the first electrode layer directly formed on the substrate does not contain ZnO. However, as compared with Comparative Example 2, which is provided with a single-layer electrode, the solar cells of Comparative Example 3 and Examples 1 to 5, in which the electrodes each include two or more layers, achieve much higher fill factors and higher conversion efficiencies.

Among the solar cells provided with the electrode having a structure including two or more layers, the solar cells of Examples 1 to 5, in which the second electrode layers and above each do not contain ZnO, achieve much higher fill factors and higher conversion efficiencies, as compared with Comparative Example 3, in which the second electrode layer contains ZnO. This is because ZnO contained in the electrode increases the specific resistance of the electrode, which is the sintered silver product, resulting in an increase in interconnect resistance of the electrode. This is apparent from a comparison between Comparative Example 1(a) and Comparative Example 2.

Moreover, Example 5 has a lower fill factor of the solar cell and lower conversion efficiency, as compared with Examples 1 to 4. The reason is considered as follows: although the second electrode layer does not contain ZnO, the first electrode layer contains excessive ZnO, leading to an increase in interconnect resistance of the electrode.

In addition, the results indicate that Comparative Example 1(b), which is obtained by dipping Comparative Example 1(a), in which the electrode directly formed on the substrate does not contain ZnO, into a 5% diluted hydrofluoric acid solution for 20 seconds, achieves a higher fill factor and higher conversion efficiency as compared with Comparative Example 2, in which it contains ZnO.

On the other hand, the electrode tensile strength measurement results shown in Table 2 have revealed the following. As for the strength of the copper foil attached to the electrode portion by soldering, the tensile strengths of Comparative Examples 2 and 3, irrespective of a single-layer structure or a multilayer structure, in which the electrode layer serving as a joint area for soldering contains ZnO, are low.

Although Comparative Example 1(b), which has the electrode containing no ZnO but is subjected to treatment with diluted hydrofluoric acid, restores conversion efficiency as described above, the tensile strength thereof is decreased, making it impracticable.

The tensile strengths of Comparative Example 1(a) and Examples 1 to 5, irrespective of a single-layer structure or a multilayer structure, in which the electrode layer serving as a joint area for soldering contains no ZnO are high enough to be worthy of modularization, offering excellent long-term reliability.

From what has been described above, the solar cells of Examples 1 to 5, in particular of Examples 1 to 4, are found to have good electrical characteristics and high tensile strength, and the effectiveness of the invention has been verified.

Examples 6 to 8, Comparative Example 4

By a method which is similar to Example 1, but is different therefrom in that a two-layer electrode is formed on the solar cell by using $TiO_2$ as an additive added to the first electrode layer 27a and setting the contents thereof at 5 wt % (Example 6), 15 wt % (Example 7), and 20 wt % (Example 8), ten solar cells were fabricated for each case.

In addition, ten solar cells were fabricated just like Comparative Example 2 except that $TiO_2$ was added to the front surface electrode 34 as an additive thereof, and the front surface electrode had a single-layer structure (Comparative Example 4).

Examples 9 to 11, Comparative Example 5

By a method which is similar to Example 1, but is different therefrom in that a two-layer electrode is formed on the solar cell by using $Bi_2O_3$ as an additive added to the first electrode layer 27a and setting the contents thereof at 5 wt % (Example 9), 15 wt % (Example 10), and 20 wt % (Example 11), ten solar cells were fabricated for each case.

In addition, ten solar cells were fabricated just like Comparative Example 2 except that $Bi_2O_3$ was added to the front surface electrode 34 as an additive thereof, and the front surface electrode had a single-layer structure (Comparative Example 5).

Examples 12 to 14, Comparative Example 6

By a method which is similar to Example 1, but is different therefrom in that a two-layer electrode is formed on the solar cell by using PbO as an additive added to the first electrode layer 27a and setting the contents thereof at 5 wt % (Example 12), 15 wt % (Example 13), and 20 wt % (Example 14), ten solar cells were fabricated for each case.

In addition, ten solar cells were fabricated just like Comparative Example 2 except that PbO was added to the front surface electrode 34 as an additive thereof, and the front surface electrode had a single-layer structure (Comparative Example 6).

For the ten solar cells of each case fabricated in the manner as described above, characteristic evaluation was conducted and the tensile strength of the electrode was measured as in Example 1.

As is the case of ZnO, the characteristic evaluation and electrode tensile strength measurement results of Examples 6 to 8 and Comparative Example 4 (Tables 3 and 4), Examples 9 to 11 and Comparative Example 5 (Tables 5 and 6), and Examples 12 to 14 and Comparative Example 6 (Tables 7 and 8) are shown in Tables 3 to 8 below. The value in the table indicates the average value of the ten solar cells of each case.

TABLE 3

| Sample | Electrode Structure | $TiO_2$ Content (wt %) | | Short-Circuit Current (mA/cm$^2$) | Open-Circuit Voltage (mV) | Fill Factor (%) | Conversion Efficiency (%) |
|---|---|---|---|---|---|---|---|
| Example 6 | Two-layer | First Layer | 5 | 35.0 | 620 | 77.5 | 16.8 |
| | | Second Layer | 0 | | | | |
| Example 7 | Two-layer | First Layer | 15 | 34.9 | 621 | 77.9 | 16.9 |
| | | Second Layer | 0 | | | | |
| Example 8 | Two-layer | First Layer | 20 | 34.9 | 618 | 73.5 | 15.8 |
| | | Second Layer | 0 | | | | |
| Comparative Example 4 | Single-layer | | 5 | 35.2 | 617 | 70.9 | 15.4 |

TABLE 4

| Sample | Electrode Structure | $TiO_2$ Content (wt %) | | Tension Strength (N/mm) | Strength Judgment |
|---|---|---|---|---|---|
| Example 6 | Two-layer | First Layer | 5 | 5.1 | Good |
| | | Second Layer | 0 | | |
| Example 7 | Two-Layer | First Layer | 15 | 4.9 | Good |
| | | Second Layer | 0 | | |
| Example 8 | Two-Layer | First Layer | 20 | 4.1 | Good |
| | | Second Layer | 0 | | |
| Comparative Example 4 | Single-Layer | | 5 | 0.8 | Poor |

TABLE 5

| Sample | Electrode Structure | | Bi₂O₃ Content (wt %) | Short-Circuit Current (mA/cm²) | Open-Circuit Voltage (mV) | Fill Factor (%) | Conversion Efficiency (%) |
|---|---|---|---|---|---|---|---|
| Example 9 | Two-layer | First Layer | 5 | 34.9 | 622 | 78.1 | 17.0 |
|  |  | Second Layer | 0 |  |  |  |  |
| Example 10 | Two-layer | First Layer | 15 | 35.1 | 620 | 78.3 | 17.0 |
|  |  | Second Layer | 0 |  |  |  |  |
| Example 11 | Two-layer | First Layer | 20 | 35.0 | 618 | 72.2 | 15.6 |
|  |  | Second Layer | 0 |  |  |  |  |
| Comparative Example 5 | Single-layer |  | 5 | 35.3 | 622 | 72.1 | 15.8 |

TABLE 6

| Sample | Electrode Structure | | Bi₂O₃ Content (wt %) | Tensile Strength (N/mm) | Strength Judgment |
|---|---|---|---|---|---|
| Example 9 | Two-layer | First Layer | 5 | 4.8 | Good |
|  |  | Second Layer | 0 |  |  |
| Example 10 | Two-layer | First Layer | 15 | 4.8 | Good |
|  |  | Second Layer | 0 |  |  |
| Example 11 | Two-layer | First Layer | 20 | 4.5 | Good |
|  |  | Second Layer | 0 |  |  |
| Comparative Example 5 | Single-layer |  | 5 | 1.3 | Poor |

TABLE 7

| Sample | Electrode Structure | | PbO Content (wt %) | Short-Circuit Current (mA/cm²) | Open-Circuit Voltage (mV) | Fill Factor (%) | Conversion Efficiency (%) |
|---|---|---|---|---|---|---|---|
| Example 12 | Two-layer | First Layer | 5 | 35.1 | 620 | 77.1 | 16.8 |
|  |  | Second Layer | 0 |  |  |  |  |
| Example 13 | Two-layer | First Layer | 15 | 35.3 | 623 | 78.5 | 17.3 |
|  |  | Second Layer | 0 |  |  |  |  |
| Example 14 | Two-layer | First Layer | 20 | 35.1 | 617 | 73.2 | 15.9 |
|  |  | Second Layer | 0 |  |  |  |  |
| Comparative Example 6 | Single-layer |  | 5 | 35.4 | 620 | 72.5 | 15.9 |

TABLE 8

| Sample | Electrode Structure | | PbO Content (wt %) | Tensile Strength (N/mm) | Strength Judgment |
|---|---|---|---|---|---|
| Example 12 | Two-layer | First Layer | 5 | 4.1 | Good |
|  |  | Second Layer | 0 |  |  |
| Example 13 | Two-layer | First Layer | 15 | 3.8 | Good |
|  |  | Second Layer | 0 |  |  |
| Example 14 | Two-layer | First Layer | 20 | 3.7 | Good |
|  |  | Second Layer | 0 |  |  |
| Comparative Example 6 | Single-layer |  | 5 | 1.1 | Poor |

Even when $TiO_2$, $Bi_2O_3$, or PbO was used as an additive, as is the case with ZnO, if the additive content of the first electrode layer was set at 20 wt %, the fill factor of the solar cell became lower than when it was set at 5 wt % or 15 wt %, and the conversion efficiency was decreased. The reason is considered as follows: as is the case with ZnO, although the second electrode layer does not contain an additive, the first electrode layer contains an excessive additive, leading to an increase in interconnect resistance of the electrode.

On the other hand, according to the electrode tensile strength measurement results, as for the strength of the copper foil attached to the electrode portion by soldering, the tensile strengths of Comparative Examples 4, 5, and 6 in which the electrode has a single-layer structure and the electrode layer serving as a joint area for soldering contains an additive are low.

The tensile strengths of Examples 6 to 14, in which the electrode layer serving as a joint area for soldering contains no additive, are high enough to be worthy of modularization, providing excellent long-term reliability.

From what has been described above, even when $TiO_2$, $Bi_2O_3$, or PbO is used as an additive, the solar cells obtained by adding an additive to the second electrode layer (Examples 6 to 14), in particular, by setting the additive content at 5 wt % or 15 wt % (Examples 6, 7, 9, 10, 12, and 13) are found to have good electrical characteristics and high tensile strength. Thus the effectiveness of the invention has been verified.

Note that the present invention is not limited to the above embodiments. The above embodiments are merely illustrative, and the technical scope of the present invention encompasses any equivalents that have substantially the same configuration as the technical idea described in the claims of the present invention and can achieve similar effects.

The invention claimed is:

1. A semiconductor substrate having at least an electrode formed thereon, wherein
    the electrode has a multilayer structure including two or more electrode layers,
    at least a first electrode layer of the multilayer structure is directly bonded to the semiconductor substrate contains at least silver and a glass frit, and contains, as an additive, at least one of oxides of Ti, Bi, Zr, V, Nb, Ta, Cr, Mo, W, Mn, Fe, Co, Ni, Si, Al, Ge, Sn, Pb, and Zn,
    at least an uppermost electrode layer formed on the first electrode layer is bonded to a wire by a solder, the uppermost electrode layer contains at least silver and a glass frit and does not contain the additive, and
    the uppermost electrode layer has a same pattern as the first electrode layer.

2. The semiconductor substrate according to claim 1, wherein a content of the additive contained in the at least first electrode layer is 1 wt % or more but less than 15 wt %.

3. The semiconductor substrate according to claim 1, wherein
    the semiconductor substrate has a pn junction,
    the electrode is a front surface electrode,
    on a side of the front surface electrode, an antireflection film is provided,
    on a side of a back surface, a back surface electrode is provided, and
    the semiconductor substrate operates as a solar cell.

4. The semiconductor substrate according to claim 2, wherein
    the semiconductor substrate has a pn junction,
    the electrode is a front surface electrode,
    on a side of the front surface electrode, an antireflection film is provided,
    on a side of a back surface, a back surface electrode is provided, and
    the semiconductor substrate operates as a solar cell.

5. A method for forming an electrode, comprising:
    a step of forming a first electrode layer by applying a conductive paste containing at least a silver powder, a glass frit, an organic vehicle, and an organic solvent, and containing, as an additive, at least one of oxides of Ti, Bi, Zr, V, Nb, Ta, Cr, Mo, W, Mn, Fe, Co, Ni, Si, Al, Ge, Sn, Pb, and Zn to a semiconductor substrate, and applying heat; and
    a step of forming an uppermost electrode layer, which is to be bonded to a wire by solder, by applying, above the first electrode layer, a conductive paste which contains at least a silver powder, a glass frit, an organic vehicle, and an organic solvent and does not contain the additive, and applying heat, the uppermost electrode layer having a same pattern as the first electrode layer.

6. The method for forming an electrode according to claim 5, wherein
    a content of the additive contained in the conductive paste forming the at least first electrode layer is 1 wt % or more but less than 15 wt %.

7. A method for fabricating a solar cell, comprising at least:
    a step of forming an antireflection film on a side of a front surface of a semiconductor substrate having a pn junction;
    a step of forming a front surface electrode in an antireflection film portion; and
    a step of forming a back surface electrode on a side of a back surface,
    wherein at least formation of the front surface electrode is performed by the method for forming an electrode according to claim 5.

8. A method for fabricating a solar cell, comprising at least:
    a step of forming an antireflection film on a side of a front surface of a semiconductor substrate having a pn junction;
    a step of forming a front surface electrode in an antireflection film portion; and
    a step of forming a back surface electrode on a side of a back surface,
    wherein at least formation of the front surface electrode is performed by the method for forming an electrode according to claim 6.

* * * * *